(12) United States Patent
Delshadpour et al.

(10) Patent No.: US 10,742,215 B1
(45) Date of Patent: Aug. 11, 2020

(54) CIRCUIT TO SUPPORT MULTIPLE VOLTAGE LEVEL INPUT/OUTPUT

(71) Applicant: NXP B.V., Eindhoven (NL)

(72) Inventors: Siamak Delshadpour, Phoenix, AZ (US); Xu Zhang, Chandler, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/417,407

(22) Filed: May 20, 2019

(51) Int. Cl.
*H03K 19/0185* (2006.01)

(52) U.S. Cl.
CPC .......................... *H03K 19/018521* (2013.01)

(58) Field of Classification Search
None
See application file for complete search history.

(56) References Cited

U.S. PATENT DOCUMENTS

| | | | |
|---|---|---|---|
| 5,508,653 A * | 4/1996 | Chu | G05F 1/465 326/63 |
| 7,009,424 B2 | 3/2006 | Khan et al. | |
| 7,119,578 B2 | 10/2006 | Correale, Jr. et al. | |
| 7,417,471 B2 | 8/2008 | Gong et al. | |
| 7,750,717 B2 | 7/2010 | Ali et al. | |
| 7,777,522 B2 | 8/2010 | Yang et al. | |
| 7,804,326 B1 | 9/2010 | Chen | |
| 8,368,429 B2 | 2/2013 | Ueno | |
| 8,816,720 B2 | 8/2014 | Kim et al. | |
| 9,225,333 B2 | 12/2015 | Purushothaman | |
| 10,211,727 B1 * | 2/2019 | Rana | G06F 1/04 |
| 10,296,075 B2 * | 5/2019 | Wang | G06F 1/26 |
| 2005/0174125 A1 * | 8/2005 | Bhattacharya | G01R 19/16519 324/522 |
| 2005/0184757 A1 * | 8/2005 | Skroch | G06F 1/06 326/63 |
| 2006/0214720 A1 | 9/2006 | Sobue | |
| 2008/0307240 A1 * | 12/2008 | Dahan | G06F 1/06 713/320 |
| 2011/0316634 A1 * | 12/2011 | Vasani | H03F 1/0244 330/296 |

(Continued)

OTHER PUBLICATIONS

Matsumoto, Y. et al. "An adaptive decision threshold control of the optical receiver for multi-gigabit terrestrial DWDM transmission systems", IEEE Optical Fiber Communication Conference and Exhibit. Technical Digest Postconference Edition 3 pgs. (2003).

(Continued)

*Primary Examiner* — Crystal L Hammond
(74) *Attorney, Agent, or Firm* — Rajeev Madnawat (57) ABSTRACT

A circuit for translating a voltage of a digital signal from a first voltage level of a first voltage domain to a second voltage level of a second voltage domain is disclosed. The circuit includes a configurable circuit to be coupled between the first voltage domain and the second voltage domain. The configurable circuit includes a plurality of parallel data paths, wherein the configurable circuit is configured to enable only one of the plurality of data paths at a given time. A first path in the plurality of parallel data paths is configured to be enabled when the first voltage level is greater than the second voltage level and a second path in the plurality of parallel data paths is configured to be enabled when the first voltage level is lesser than the second voltage level.

16 Claims, 4 Drawing Sheets

(56) References Cited

U.S. PATENT DOCUMENTS

| | | | |
|---|---|---|---|
| 2012/0120082 A1* | 5/2012 | Ku | H03K 19/00315 |
| | | | 345/520 |
| 2013/0271181 A1* | 10/2013 | Kim | G06F 1/26 |
| | | | 326/63 |
| 2014/0159773 A1* | 6/2014 | Shin | H03K 19/0016 |
| | | | 326/80 |
| 2015/0177823 A1* | 6/2015 | Maiyuran | G06F 1/324 |
| | | | 713/320 |
| 2015/0194961 A1* | 7/2015 | Luthra | H03K 19/018571 |
| | | | 365/148 |
| 2017/0012627 A1* | 1/2017 | Kapoor | G06F 1/3234 |
| 2017/0063229 A1* | 3/2017 | Powell | G05F 1/59 |
| 2018/0335454 A1* | 11/2018 | Varsha | G01R 19/16552 |

OTHER PUBLICATIONS

Syuto, M. et al. "Multi-Input Variable-Threshold Circuits for Multi-Valued Logic Functions", IEEE Proceedings 30th International Symposium on Multiple-Valued Logic, 6 pgs., (2000).

Non-Final for U.S. Appl. No. 16/406,976, 9 pgs. (dated Jul. 9, 2019).

Notice of Allowance for U.S. Appl. No. 16/406,976, 7 pgs. (dated Aug. 13, 2019).

\* cited by examiner

CIRCUIT TO SUPPORT MULTIPLE VOLTAGE LEVEL INPUT/OUTPUT

BACKGROUND

Semiconductor chips and devices may include a variety of logic circuits and sub-systems each operating at different voltage levels. A system fabricated in a chip may be designed to communicate with external systems through communication ports where the logic fabricated in the chip may be operating at a different voltage level than the operating voltage level of the external systems coupled to the chip. Typically, an additional pin can be added in a chip to receive a different voltage supply for input/output operations. However, in many cases, adding an additional pin in a chip is not practically feasible.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a circuit for translating a voltage of a digital signal from a first voltage level of a first voltage domain to a second voltage level of a second voltage domain is disclosed. The circuit includes a configurable circuit to be coupled between the first voltage domain and the second voltage domain. The configurable circuit includes a plurality of parallel data paths, wherein the configurable circuit is configured to enable only one of the plurality of data paths at a given time. A first path in the plurality of parallel data paths is configured to be enabled when the first voltage level is greater than the second voltage level and a second path in the plurality of parallel data paths is configured to be enabled when the first voltage level is lesser than the second voltage level. The first path may include a resistor divider.

In some examples, a third path in the plurality of parallel data paths may be includes that is configured to be enabled when the first voltage level is equal to the second voltage level. Each of the plurality of parallel data paths may include a switch to enable or disable the each of the plurality of parallel data paths.

In one example, the second path may include a level shifter circuit. Different types of level shifters may be used, for example, the level shifter circuit includes a comparator, which is formed by an input differential transistor pair with a matched current mirror load, a hysteresis adjusting device, a parallel signal path circuit and a reference voltage generator. The comparator and the hysteresis adjusting device set transition thresholds and hysteresis of the level shifter. The parallel signal path circuit receives input from level shifter input and outputs signal in parallel to the comparator output, with the purpose to speed up the transitions. The level shifter circuit also includes a reference voltage generator circuit to provide a reference voltage to the comparator and is connected to one of the inputs of the comparator.

In some examples, the parallel signal path circuit may be implemented as an inverter. He reference voltage generator may be implemented using a resistor divider or a source follower transistor.

In some examples, the parallel signal path circuit may preferably speed up the transition in one direction, high-to-low or low-to-high and compromise the transition speed in the other direction to reduce static or off-mode power consumption by sizing the pull-up or pull-down device weaker.

In some examples, the hysteresis adjusting device may be implemented by a single transistor device, which is connected between the sources of the comparator input devices and the drain of the reference connected device of the comparator. The gate of the hysteresis adjusting transistor is connected to the drain of the input connected device of the comparator.

In some examples, the comparator may include a current limiting device coupled between the sources of the input devices and a supply voltage or ground (depending on the device type used in the implementation). The limiting device is optimized to minimize current when the input is at its static or off-state value. For example, I2C pin stays at logic high when there's no data communication. An PMOS limiting device may have a small width over length ratio in this application.

In some examples, the level shifter circuit may further include a first switch coupled between the input differential pair and a supply voltage or ground (depending on the device type) to disconnect power to the first switch when a level shifter enable signal is off. The level shifter circuit may further include a second switch coupled between the parallel signal path circuit and supply/ground to disconnect power to the parallel signal path circuit when a level shifter enable signal is off.

The reference voltage generator circuit may include a first resistor and a second resister coupled in series. The first resistor is coupled to the supply voltage. The second resistor is coupled to ground.

The level shifter circuit may further include a third switch coupled between the first/second resistor in the reference voltage generator and the supply/ground to disconnect the reference generator from the supply voltage or ground when a level shifter enable signal is off. The third switch may be NMOS and the gate of the third switch is driven by the level shifter enable signal.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

Note that figures are not drawn to scale. Not all components in the chip are shown. The omitted components are known to a person skilled in the art.

DETAILED DESCRIPTION

Many well-known manufacturing steps, components, and connectors have been omitted or not described in details in the description so as not to obfuscate the present disclosure.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", "one example", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Logic 1 and logic 0 may theoretically correspond to the chip operating voltage (e.g., VDD) and 0 voltage respectively. However, in practice, typically, a voltage level greater than or equal to 0.7×VDD may be treated as logic 1 and a voltage level less than or equal to 0.3×VDD may be treated as logic 0. A problem arises when a first chip is operating at a different voltage than a second chip coupled to the first chip and exchanging data. For example, if the first chip is operating at 1.8V and the second chip is operating at 1.2V, an incoming high bit from the second chip may be represented by 0.7×1.2=0.84V. However, for the first chip, logic 1 needs to be represented by 0.7×1.8=1.26V or higher. Therefore, if this incoming bit is passed on to the internal logic of the first chip, the incoming bit may not be recognized as a valid data. Therefore, the voltage level needs to be translated prior to inputting the data into the internal logic. One simple solution may be to add another pin to the first chip to accept the operating voltage of the second chip and vice versa so than a simple switch inside each of the chips can translate the voltage levels. However, adding an additional pin may not be practical in all cases.

When a logic circuit in a chip or system operates on a first voltage level and needs to communicate with another chip or system that operates on a second voltage level, the voltage levels need to be changed. In some examples, a chip may include General Purpose Input/Output (GPIO) and/or Inter-Integrated Circuit (I2C) pins for sending a signal to outside of the chip or receiving signal from outside of the chip. In this example, if the internal logic in the chip operates on 1.8V and a device coupled to the chip through GPIO or I2C pins operates at 1.2V, there will be a need to use a circuit coupled to the GPIO or I2C pins and the internal logic in the chip.

The embodiments described herein disclose a circuit to translate a first voltage level and a second voltage level of a signal from one voltage domain to another. The circuit may include a level shifter circuit, which may include a comparator, the comparator may include an input differential transistor pair with a matched current mirror load. The embodiment described herein removes the requirement of an additional pin to receive the power supply of the second voltage domain. An on-chip DC-DC convertor is also not needed. The embodiments described herein takes less space on the chip as compared to the on-chip DC-DC converter for changing the voltage levels. Further, the embodiments described herein virtually do no impact on IO performance.

In some examples, in a level shift, a parallel signal path circuit may be included to reduce a voltage transition lag caused by the comparator. A hysteresis adjusting device may be included to set high-to-low and low-to-high voltage thresholds. The level shifter may also include a reference voltage generator circuit to provide a reference voltage to the comparator. The parallel signal path circuit may include an inverter. The comparator includes an input side transistor and a reference connected transistor driven by the reference voltage. The hysteresis adjusting device includes a hysteresis transistor connected between a source and a drain of the reference connected transistor. The gate of the hysteresis transistor is coupled to a drain of an input connected transistor of the comparator and the input connected transistor is driven by a signal at an input port of the comparator. The comparator may also include a current limiting device coupled between sources of the two input pair transistors and one of a supply voltage and ground.

In some embodiments, the current limiting device is optimized to minimize a current when a level shifter circuit enable signal is off and the reference voltage generator circuit includes a first resistor and a second resister coupled in series and the first resistor coupled to the supply voltage. A first switch coupled between the input differential pair and one of a supply voltage and ground is included to disconnect power to the first switch when a level shifter enable signal is off. A second switch coupled between the parallel signal path circuit and one of the supply voltage and ground is included to disconnect power to the parallel signal path circuit when a level shifter enable signal is off. A single supply is applied to power the entire level shifter circuit.

Figure 1:
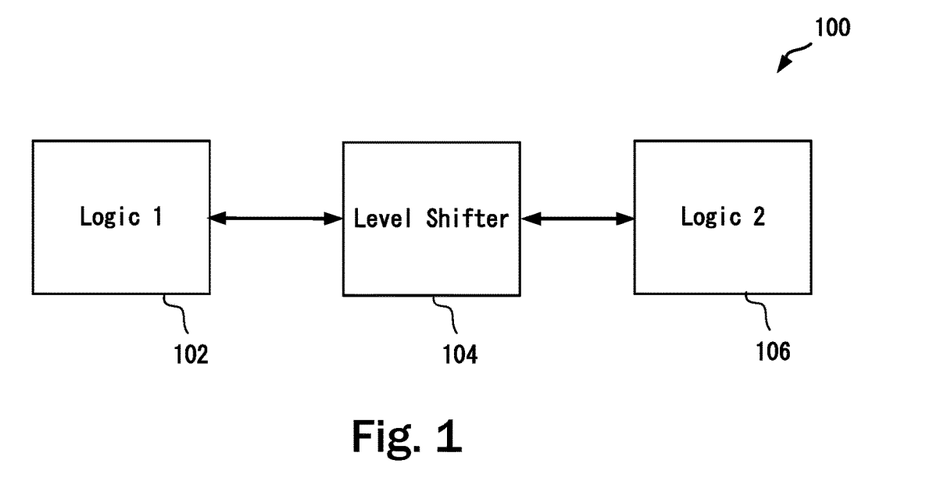
FIG. 1 depicts a level shifter coupled between two voltage domains.

FIG. 1 shows a system 100 that includes a level shifter 104 coupled between a first logic circuit 102 and a second logic circuit 106. In one example, the first logic circuit 102 and the level shifter 104 may be incorporated in a same integrated circuit or chip while the second logic circuit 106 may be coupled to the chip through a pin (e.g., GPIO, I2C). The level shifter 104 may include a transmitter path and a receiver path. The transmitter path will translate the level of a signal outputted by the first logic circuit 102 to match the voltage level of the second logic circuit 106. Similarly, the receiver path will translate the level of a received signal from to the voltage level of the first logic circuit 102.

Figure 2:
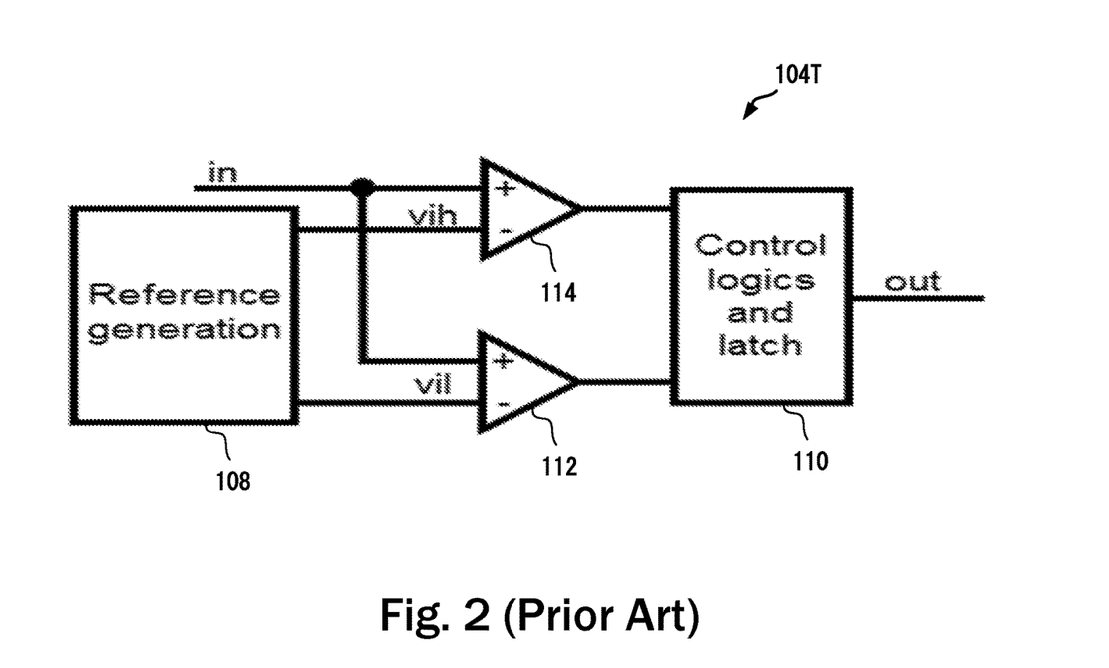
FIG. 2 depicts an example of a typical level shifter circuit.

FIG. 2 shows a typical level shifter 104T. In this example, the level shifter 104T includes a reference generation circuit 108. In some embodiments, reference voltages (e.g., vil, vih) may be generated by using two resistors connected in series and to a supply voltage. The values of the resistors may be selected to produce a particular reference voltage. A first comparator 112 may be coupled to the input signal and the reference voltage vil and a second comparator 114 may be coupled to the input signal and the reference voltage vih. Outputs of the first and the second comparators may be inputted to a control and latch circuit 110. The control and latch circuit 110 may combine the two comparator outputs and provide a buffering to provide an output signal. The level shifter in this example may introduce an undesirably high power consumption for realizing a several nano-seconds delay between the input and output. In addition, the level shifter 104T may take 3-10 times of die area as compared to the level shifter described in FIG. 3.

Figure 3:
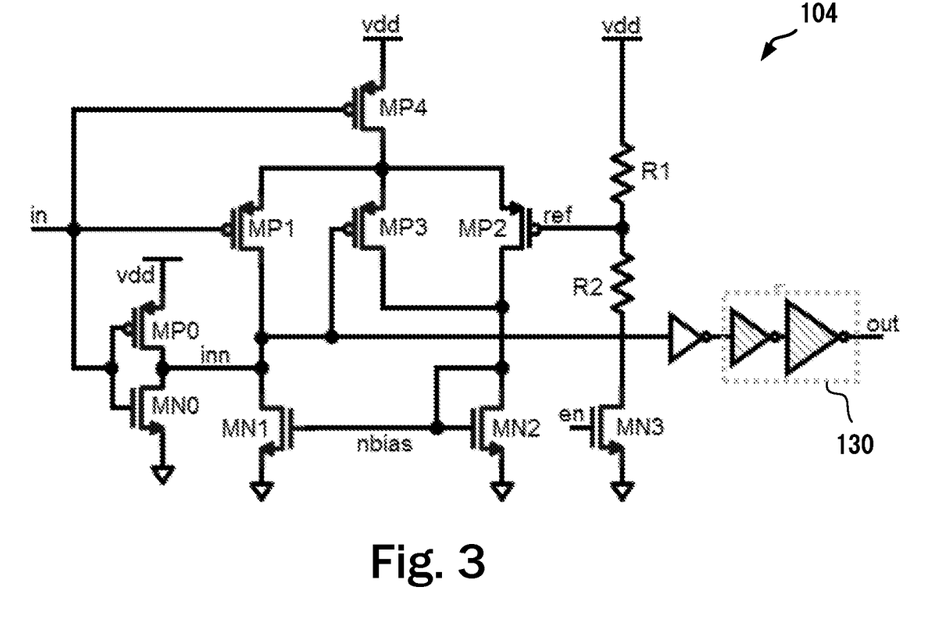
FIG. 3 shows a level shifter circuit that uses only one supply voltage in accordance with one or more embodiments of the present disclosure.

FIG. 3 shows a level shifter 104 in another embodiment. Matched devices MP1 and MP2 and matched devices MN1 and MN2 form the core of a comparator structure which sets the voltage threshold of the level shifter 104 approximately the reference voltage "ref". The reference voltage "ref" is the divider output of resistors R1 and R2 where R1 is coupled to VDD and R2 is coupled to ground. A switch MN3 switches the divider circuit including R1 and R2 on and off depending on an enable signal "en". The enable signal is used to turn the level shifter 104 on or off. For example, in the off mode, the level shifter may be disabled by changing the enable signal "en". Moreover, during the transmitter mode, the level shifter in the receiver line may be disabled. MP1 is an input connected transistor that is driven by the input signal to the comparator.

A current limiting device MP4 provides the tail biasing for the comparator core and limits the static current when input is at logic high in an I2C application. A hysteresis adjusting device MP3 provides a required hysteresis control (for example, GPIO and I2C specifications may specify a particular hysteresis). The comparator core and hysteresis control from MP3 provide the required voltage threshold accuracy (e.g., LOW and HIGH voltage ranges), for example, as specified by I2C and GPIO specifications.

The comparator core alone is slow, especially during the low to high transition when the current passing the transistor MP2 has to raise the voltage nbias. When nbias is high, the transistor MN1 starts to pull-down the voltage inn. To speed up the low to high signal transition, a pull-down device MN0 is added. The device MN0 pulls down inn directly without extra delay, hence the device MN0 acts as a hysteresis adjusting device. The term "hysteresis" is the voltage difference between the high-to-low and low-to-high thresholds. For example, a low-to-high voltage threshold is the minimum input voltage to cause an output to transition from logic low to logic high. Similarly, a high-to-low voltage threshold is the maximum input voltage that can cause the output to transition from a logic high to logic low. A pull-up device MP0 is added to speed up the high to low transition similar to the operations of MN0 described above. Devices MN0 and MP0 form a parallel signal circuit from level shifter input to comparator output. However, because the pull-up device MP0 is connected to the supply voltage VDD directly, there may be a static current through the device MP0 even when the input voltage is held at the logic high, as the logic high at the input may be less than VDD. Thus, the device MP0 may be sized with a smaller (compared to the devices MP1 and MP2) Width/Length (W/L) ratio to reduce the static current when input is held at logic high in an active no communication mode (this may be the dominating use case for I2C applications). But, a reduction in W/L ratio may also reduce the transition speed of the device MP0. Nevertheless, the high to low transition is relatively a faster operation in the comparator core, as the devices MP1 and MP4 charges the voltage signal inn directly. In some examples, similar to the sizing of W/L ratio of the device MP0, the W/L ratio of the device MP4 may be kept low to save fabrication or die area and to lower static power consumption. The level shifter 104 may also include an output buffer 130 to drive a capacitive load according to the requirement of the circuit that receives the signal from the level shifter 104.

Figure 4:
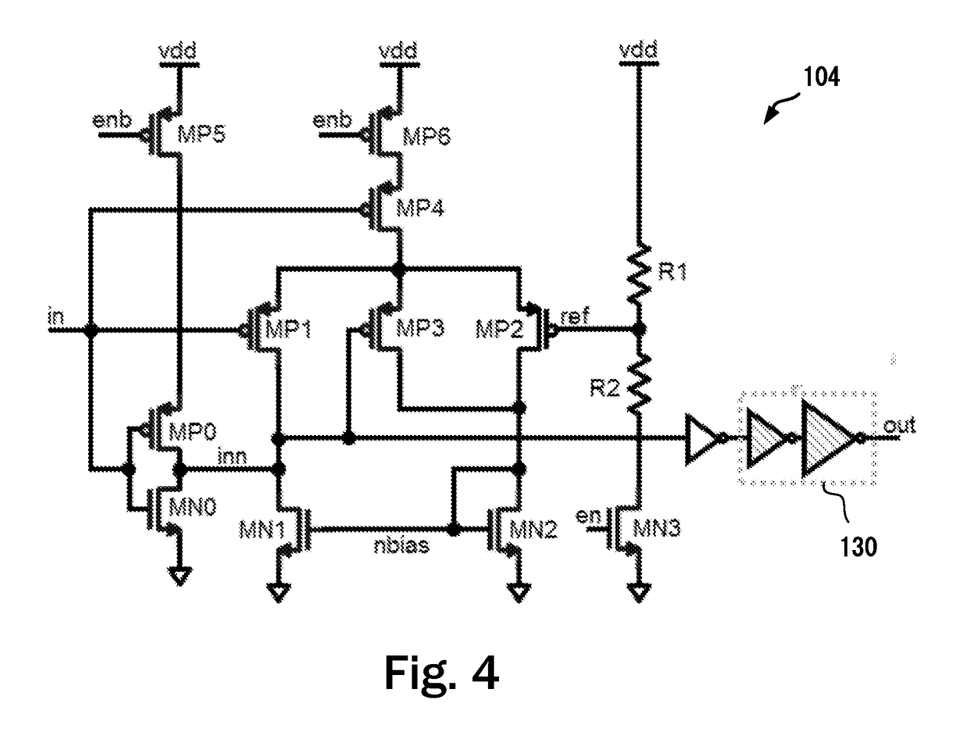
FIG. 4 shows a level shifter circuit in accordance with one or more embodiments of the present disclosure.

FIG. 4 shows the level shifter 104 in yet another embodiment. The level shifter 104 shown in FIG. 4 includes all features of the level shifter shown in FIG. 3. In addition, a switch MP5 is coupled between the device MP0 and VDD and a switch MP6 is coupled between the device MP4 and VDD. The switches MP5 and MP6 are driven by a disable signal "enb" (which is the inverted form of the enable signal "en") to cut off power supply to the devices (or transistors) MP0 and MP4 when the level shifter 104 is in the disabled mode, to conserve power.

FIG. 3 and FIG. 4 show implementations based on a comparator with PMOS input differential pair. A person skilled in the art would appreciate that an input differential pair implementation using NMOS devices is possible and would operate similar to the PMOS implementation described in FIGS. 3 and 4.

Figure 5:
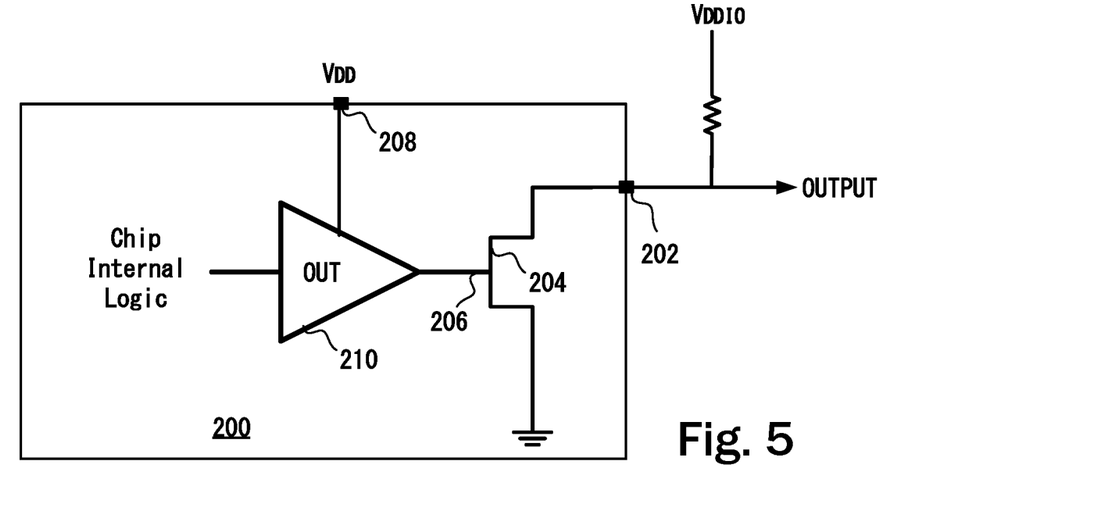
FIG. 5 shows a part of a chip depicting a circuit to translate an output digital signal from a first voltage domain to a second voltage domain in accordance with one or more embodiments of the present disclosure.

FIG. 5 shows a part of a chip 200 depicting a circuit to translate an output digital signal from a first voltage domain to a second voltage domain. The chip 200 includes an output pin 202 to output digital data to externally coupled chip (not shown), a chip supply pin 208 to receive a chip supply voltage (VDD) and an output data driver 210 to provide the data to be transmitted to the externally coupled chip. The output data driver 210 receives the data from an internal logic circuit (not shown) of the chip 200. The output pin 202 may be coupled to the supply voltage of the externally coupled chip (VDDIO). For the ease of description only, it is assumed that VDD is different from VDDIO. The embodiments described herein would operate in all three scenarios, e.g., VDD=VDDIO, VDD>VDDIO and VDD<VDDIO. A switch 204 is coupled to the output of the output driver 210 via the gate 206 of the switch 204. At the output pin 202, logic 1 and logic 0 will be automatically in the voltage domain of the externally coupled chip because the output of the output driver 210 will simply be turning on or off the switch 204.

Figure 6:
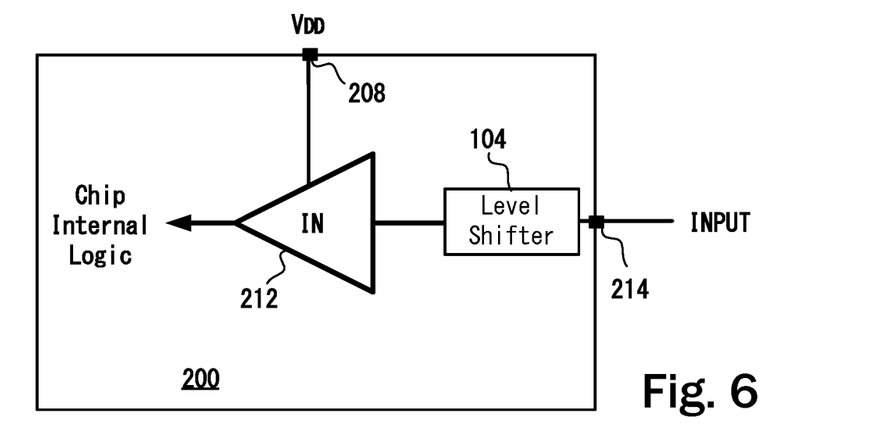
FIG. 6 shows a part of the chip depicting a circuit to translate an input digital signal from the second voltage domain to the first voltage domain in accordance with one or more embodiments of the present disclosure.

FIG. 6 shows a part of the chip 200 depicting a circuit to translate an input digital signal from the voltage domain of the externally coupled chip to the voltage domain of the chip 200. The chip 200 further includes an input driver 212 to receive data from the externally coupled chip via the input pin 214. The level shifter 104, as described in FIG. 3 or 4, is coupled between the input pin 214 and the input of the input driver 212. The level shifter 104 translates the logic voltage levels from the voltage domain of the externally coupled chip to the voltage domain of the chip 200.

Figure 7:
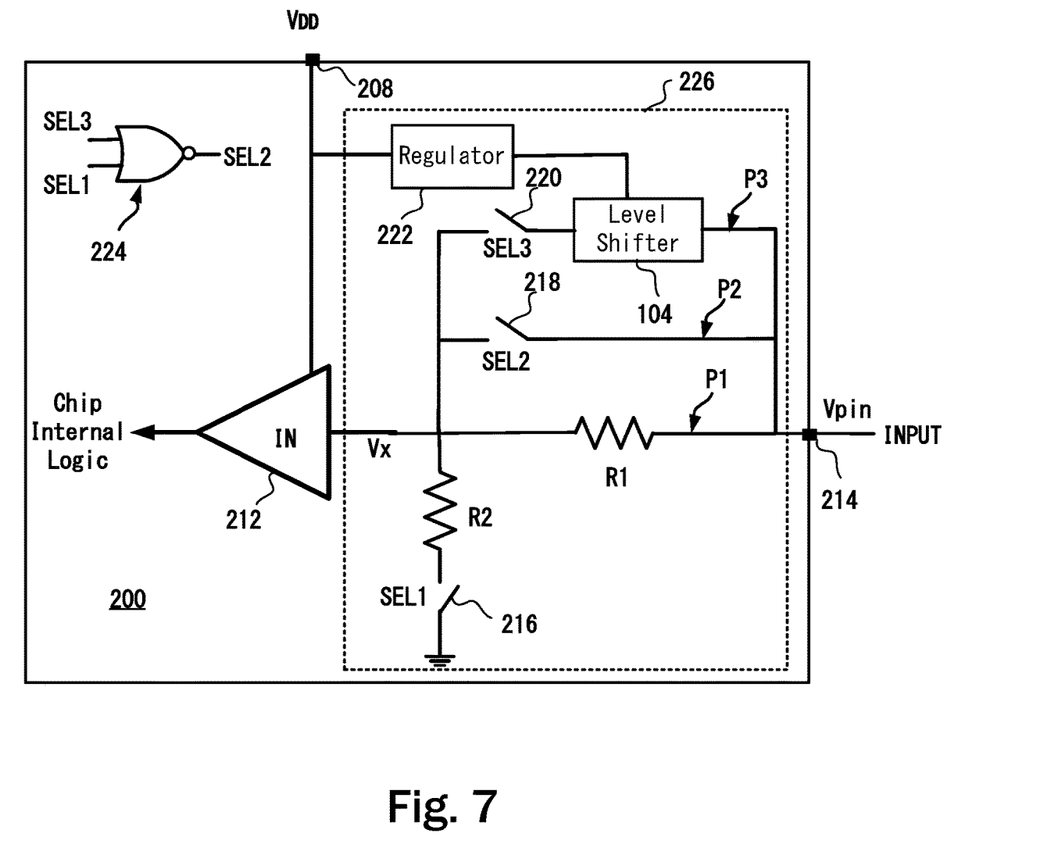
FIG. 7 shows a part of the chip depicting a configurable circuit to translate an input digital signal from the second voltage domain to the first voltage domain in accordance with one or more embodiments of the present disclosure.

FIG. 7 shows a part of the chip 200 depicting a configurable circuit 226 to translate an input digital signal from the voltage domain of the externally coupled chip to the voltage domain of the chip 200. The configurable circuit 226 is coupled between the input pin 214 and the input of the input driver 212. The input driver 212 supplies the received data to the internal logic of the chip 200.

The configurable circuit 226 main include a plurality of independent data paths (e.g., P1, P2, P3) to carry the data received at the input pin 214 to the input of the input driver 212. The plurality of independent data paths may be parallel to each other and at a given time only one of the plurality of data paths can be enabled. To enable the selection of only one data path in the plurality of independent data paths, on/off switches (e.g., 216, 218, 220) may be used. The switches 216, 218, 220 are switchable using control signals SEL1, SEL2, SEL3 respectively. An optional logic circuit 224 that includes a NOR gate may be used to generate SEL2 from the control signals SE1 and SEL2. It should be noted that typically, the supply voltage of the chip 200 and the circuits coupled to the input pin 214 do not change after a system that includes the chip 200 and external chips coupled to the chip 200 is shipped. Hence, in some examples, a path from the paths P1, P2, P3 may be selected through the switches 216, 218, 220 at the design or manufacturing time of the chip 200. The switch configuration may not change once set.

In one embodiment, the configurable circuit 226 may includes a data path P1 that can be enabled or disabled using the control signal SELL The data path P1 may be enabled, using the switch 216, when the operating voltage (VDDIO) of the externally coupled chip is higher than the operating voltage (VDD) of the chip 200. For example, if VDDIO is 3.3V and VDD is 1.8V, a resistor divider including resistors R1, R2 may be used.

Assuming the voltage at the input pin 214 is Vpin (which may 0 to 0.3*VDDIO for logic 0 and 0.7*VDDIO to VDDIO for logic 1), the voltage at the input of the input driver 212 may be calculated as follows:

$$Vx = Vpin*(R2/(R1+R2))$$

The values of R1 and R2 may be selected such that R2/(R1+R2)=VDD/VDDIO. Hence, in the above example, R2/(R1+R2)=1.8/3.3 to scale down the logic 1 and logic 0 voltages to the level of 1.8V. Assuming Vpin is at the lowest threshold for logic 1, e.g., 0.7*3.3=2.31V. Then Vx=1.26V according to the equation above at R2/(R1+R2)=1.8/3.3. The lowest logic 1 threshold for 1.8V supply=0.7*1.8=1.26V.

The circuit coupled to the input pin 214 (or the externally coupled chip) may also include a resistor Rext, which may add another voltage divider to the voltage divider including R1 and R2. To avoid loading effect, in some embodiments, the values of R1 and R2 may be selected such that R1+R2>>Rext. If smaller value R1+R2 is selected, this value should be considered in combination of Rext to derive a proper Vx. Typically, a recommended value of Rext value is included in the chip specifications to ensure proper operations of the chip 200.

When VDDIO is lower than VDD, the switch 220 is enabled to enable the data path P3. For example, if VDDIO is 1.2V and VDD is 1.8V, the data path P3 may be enabled. The data path P3 includes a level shifter 104. The level shifter 104 may be used to scale up from the low voltage to the high voltage. The level shifter 104 may need a 1.2V supply (in this example), see the ref voltage at the gate of the device MP2 in FIG. 3 or FIG. 4. An optional regulator 222 may be used to provide a low voltage supply from a high voltage supply, as for example from 1.8V VDD to 1.2V. In some examples, the regulator 222 may be implemented using a simple source follower transistor with its gate is coupled to VDD=1.8V, to provide one threshold voltage lower than 1.8V which is roughly 1.2V. In another embodiment, when a simple source follower implementation is not feasible to provide a desired voltage, a resistor divider, as shown in FIG. 3 or FIG. 4 including resistor R1, R2 may be used. The operation of the level shifter 104 is already described in FIG. 3 and FIG. 4.

In one example, when the chip 200 is being used in the environment when VDD and VDDIO are equal, the data path P2 may be included and enabled to simply pass the input signal without any voltage translation.

Some or all of these embodiments may be combined, some may be omitted altogether, and additional process steps can be added while still achieving the products described herein. Thus, the subject matter described herein can be embodied in many different variations, and all such variations are contemplated to be within the scope of what is claimed.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A circuit for translating a voltage of a digital signal from a first voltage level of a first voltage domain to a second voltage level of a second voltage domain, the circuit comprising a configurable circuit to be coupled between the first voltage domain and the second voltage domain, wherein the configurable circuit includes a plurality of parallel data paths, wherein the configurable circuit is configured to enable only one of the plurality of data paths at a given time, wherein a first path in the plurality of parallel data paths is configured to be enabled when the first voltage level is greater than the second voltage level and a second path in the plurality of parallel data paths is configured to be enabled when the first voltage level is lesser than the second voltage level.

2. The circuit of claim 1, wherein a third path in the plurality of parallel data paths is configured to be enabled when the first voltage level is equal to the second voltage level.

3. The circuit of claim 1, wherein each of the plurality of parallel data paths includes a switch to enable or disable the each of the plurality of parallel data paths.

4. The circuit of claim 1, wherein the first path includes a resistor divider.

5. The circuit of claim 1, wherein the second path includes a level shifter circuit, the level shifter circuit comprising:
   a comparator including an input differential transistor pair with a matched current mirror load;
   a parallel signal path circuit to reduce a voltage transition lag caused by the comparator;
   a hysteresis adjusting device; and
   a reference voltage generator circuit to provide a reference voltage to the comparator.

6. The circuit of claim 5, wherein the parallel signal path circuit includes an inverter.

7. The circuit of claim 5, wherein the comparator includes an input side transistor and a reference connected transistor driven by the reference voltage.

8. The circuit of claim 7, wherein the hysteresis adjusting device includes a hysteresis transistor connected between a source and a drain of the reference connected transistor.

9. The circuit of claim 8, wherein a gate of the hysteresis transistor is coupled to a drain of an input connected transistor of the comparator, wherein the input connected transistor is driven by a signal at an input port of the comparator.

10. The circuit of claim 7, wherein the comparator further includes a current limiting device coupled between sources of a pair of the input side transistors and one of a supply voltage and ground.

11. The circuit of claim 10, wherein the current limiting device is optimized to minimize a current when a level shifter circuit enable signal is off.

12. The circuit of claim 5, wherein the reference voltage generator circuit includes a first resistor and a second resister coupled in series and the first resistor coupled to the supply voltage.

13. The circuit of claim 5, further including a first switch coupled between the input differential pair and one of a supply voltage and ground to disconnect power to the first switch when a level shifter enable signal is off.

14. The circuit of claim 5, further including a second switch coupled between the parallel signal path circuit and one of the supply voltage and ground to disconnect power to the parallel signal path circuit when a level shifter enable signal is off.

15. The level shifter circuit of claim 5, wherein a single supply is applied to power the level shifter.

16. The circuit of claim 5, wherein the reference voltage generator includes a source follower transistor with a gate, wherein the gate is coupled to a supply voltage.

* * * * *